United States Patent [19]

Hayward et al.

[11] Patent Number: 4,801,999

[45] Date of Patent: Jan. 31, 1989

[54] INTEGRATED CIRCUIT LEAD FRAME ASSEMBLY CONTAINING VOLTAGE BUSSING AND DISTRIBUTION TO AN INTEGRATED CIRCUIT DIE USING TAPE AUTOMATED BONDING WITH TWO METAL LAYERS

[75] Inventors: James Hayward, Mountain View; Candice H. Brown, San Jose, both of Calif.

[73] Assignee: Advanced Micro Devices, Inc., Sunnyvale, Calif.

[21] Appl. No.: 73,557

[22] Filed: Jul. 15, 1987

[51] Int. Cl.$^4$ ...................... H01L 23/48; H01L 23/12
[52] U.S. Cl. ......................................... 357/70; 357/80
[58] Field of Search ............................. 357/70, 80, 72; 174/52 FP

[56] References Cited

U.S. PATENT DOCUMENTS

| | | | |
|---|---|---|---|
| 3,838,984 | 10/1974 | Crane et al. | 357/70 |
| 4,288,841 | 9/1981 | Gogal | 357/70 |
| 4,410,905 | 10/1983 | Grabbe | 357/70 |
| 4,417,266 | 11/1983 | Grabbe | 357/70 |
| 4,496,965 | 1/1985 | Orcutt et al. | 357/70 |
| 4,587,548 | 5/1986 | Grabbe et al. | 357/70 |
| 4,680,613 | 7/1987 | Daniels et al. | 357/70 |
| 4,725,878 | 2/1988 | Miyauchi et al. | 357/71 |
| 4,734,818 | 3/1988 | Hernandez et al. | 174/52 FP |

Primary Examiner—Andrew J. James
Assistant Examiner—Sheila V. Clark
Attorney, Agent, or Firm—John P. Taylor

[57] ABSTRACT

An improved integrated circuit package is disclsoed which comprises a flexible lead frame assembly 2 having an integrated circuit die 60 mounted thereto. Lead frame assembly 2 comprises a first conductive metal layer 10 comprising metal leads 18 and 28 capable of being electrically connected to die 60, a flexible dielectric layer 30 attached to at least a portion of the first conductive metal layer 10, and a second metal conductive layer 40 having a portion attached to the opposite side of dielectric layer 30 and also comprising one or more leads 48, 54, and 56 capable of being electrically attached to the die, at least one of the metal layers 10 or 40 further comprises at least one metal bus pattern 12 or 32 or 42 with metal leads 18, 28, and 48 capable of being electrically attached to die 60. In a preferred embodiment, each of the two conductive metal layers 10 and 40 comprises at least one metal bus 12, 22, or 42 with leads 18, 28, and 48 for interconnecting the respective metal bus with pads 64 on integrated circuit die 60.

30 Claims, 7 Drawing Sheets

INTEGRATED CIRCUIT LEAD FRAME ASSEMBLY CONTAINING VOLTAGE BUSSING AND DISTRIBUTION TO AN INTEGRATED CIRCUIT DIE USING TAPE AUTOMATED BONDING WITH TWO METAL LAYERS

BACKGROUND OF THE INVENTION

1. Field of the Invention

This invention relates to an integrated circuit package which includes power busses and signal connections formed on a two level tape structure used to provide connections to the integrated circuit die.

2. Description of the Related Art

In the packaging of integrated circuit structures, it is common to provide a metal tape assembly comprising a series of partially stamped out lead fingers usually attached together by a metal frame which is removed after the leads are connected to the integrated circuit die. Typical of such a lead frame tape assembly is the structure shown in Burns U.S. Pat. No. 4,413,404 which shows a number of metal foil leads fingers joined together by a central frame or ring which is then torn away after attachment of the die to the metal lead fingers.

Such metal lead assemblies are conventionally provided on a plastic dielectric tape which permits automation of the packaging process giving rise to the name or designation Tape Automated Bonding or TAB. Such a composite tape comprising a metal lead frame with a dielectric film backing material is shown in Angelucci et al U.S. Pat. No. 4,380,042 and Phy U.S. Pat. No. 4,380,566.

It is also known to provide an integrated circuit packaging means in the form of a printed circuit (PC) board structure comprising a PC board formed with a conventional printed circuit pattern on one side of a rigid dielectric material and a printed circuit pattern on the other side which includes a series of metal leads which extend over a cutaway portion of the dielectric material to facilitate electrical connection to an integrated circuit die mounted in the cutaway portion of the PC board structure. Such a structure is illustrated and described in Grossman et al U.S. Pat. No. 3,739,232.

As the size of integrated circuit structures shrinks, the space taken up on such dies with power busses as well as the possible added resistance imparted to the circuitry by attempts to shrink such power busses, it becomes more attractive to consider providing such power busses external to the integrated circuit die. It would be particularly desirable if such power bus circuitry could be made a part of the packaging without adding further structure to the package in the form of an external PC board or the like added to the package.

SUMMARY OF THE INVENTION

It is, therefore, an object of this invention to provide an improved integrated circuit package comprising a flexible lead frame structure comprising two metal layers and capable of being bonded to a integrated circuit die.

It is another object of this invention to provide an improved integrated circuit package comprising a flexible lead frame structure capable of being bonded to an integrated circuit die and further comprising a first metal conductive layer, a second metal conductive layer.

It is yet another object of this invention to provide an improved integrated circuit package comprising a flexible lead frame structure capable of being bonded to an integrated circuit die and further comprising a first metal conductive layer having one or more electrical busses forming a portion thereof, a second metal conductive layer having one or more lead fingers forming a portion thereof.

It is a further object of this invention to provide an improved integrated circuit package comprising a flexible lead frame structure for providing electrical connection to an integrated circuit die comprising a first metal conductive layer having one or more electrical busses and one or more lead fingers forming a portion thereof, a second metal conductive layer also having on or more lead fingers forming a portion thereof.

It is yet a further object of this invention to provide an improved integrated circuit package comprising a flexible lead frame structure for electrical attachment of an integrated circuit die thereto comprising a first conductive layer, a second metal conductive layer, and a flexible dielectric material electrically separating the metal conductive layers from one another, wherein each of the metal conductive layers comprises one or more electrical busses and one or more lead fingers forming a portion thereof.

It is still a further object of this invention to provide an improved integrated circuit package comprising an integrated circuit die electrically attached to a flexible lead frame structure comprising a first conductive layer, a second metal conductive layer, and a flexible dielectric material electrically separating the metal conductive layers from one another, wherein each of the metal conductive layers comprises one or more electrical busses, and each of the one or more electrical busses comprises one or more buss portions and one or more lead fingers forming a portion thereof.

These and other objects of the invention will be apparent from the drawings and accompanying description.

In accordance with the invention, an improved integrated circuit flexible lead frame assembly for mounting an integrated circuit die comprises a first conductive metal layer comprising one or more metal leads capable of being electrically connected to the die, a flexible dielectric layer attached to at least a portion of the first conductive metal layer, and a second metal conductive layer having a portion attached to the opposite side of the dielectric layer and also comprising one or more leads capable of being electrically attached to the die, at least one of the metal layers further comprising at least one metal bus pattern with one or more metal leads capable of being electrically attached to the die.

In a preferred embodiment, each of the two conductive metal layers comprises at least one metal bus with one or more leads for interconnecting the metal bus with portions of the integrated circuit die.

DETAILED DESCRIPTION OF THE INVENTION

Figure 1:
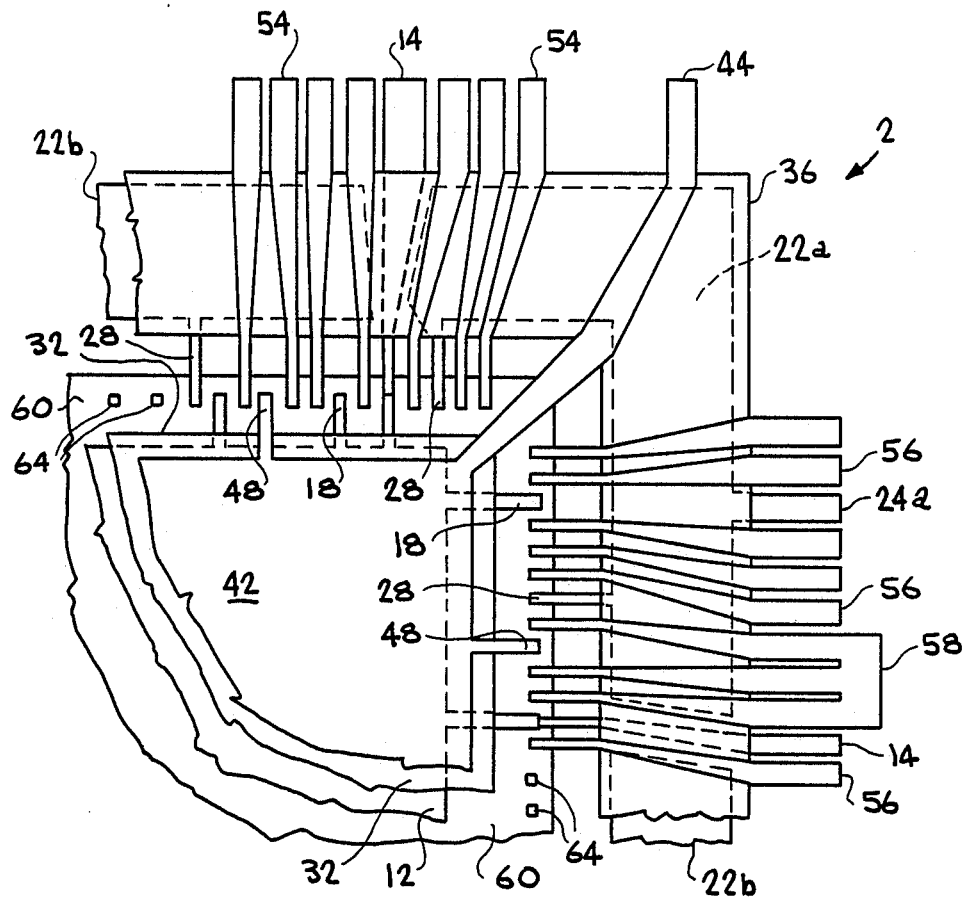
FIG. 1 is a top view of the lead frame assembly of the invention.
Figure 2:
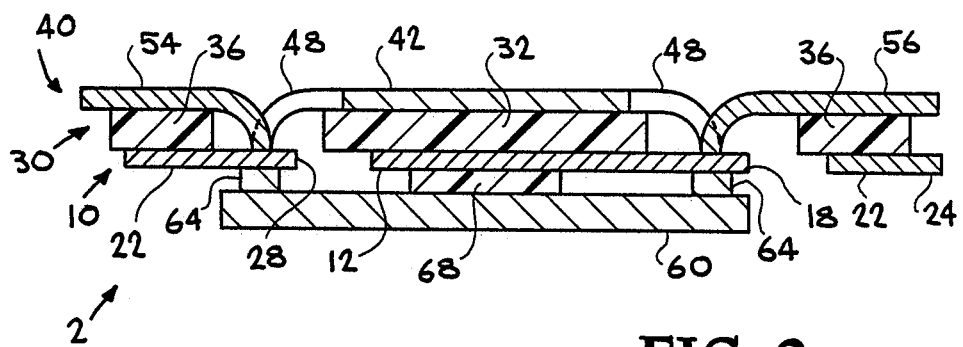
FIG. 2 is a vertical cross section of the lead frame assembly of the invention shown with an integrated circuit die mounted thereto.

Referring now to FIGS. 1 and 2, the lead frame assembly of the invention is generally indicated at 2 comprising a first patterned metal layer, generally indicated at 10 in FIG. 2, a flexible dielectric insulating layer, generally indicated at 30 in FIG. 2, and a second patterned metal layer, generally indicated at 40 in FIG. 2.

In accordance with the invention, each of the metal layers is patterned to permit the formation of metal leads from both metal layers and to permit attachment of these leads to appropriate pads or terminals on an integrated circuit die. Thus, first metal layer 10 may be divided into a central power bus portion 12 which may be generally rectangular. One or more bus power leads 14 are provided to supply power to bus 12 from an external source. Leads 18 extend out from central bus 12 to provide connection to lead pads 64 on integrated circuit die 60 which may be bonded at 68 to the underside of metal bus 12 using a suitable bonding agent such as an organic bonding agent.

The size of central power bus 12 will generally be determined by the size of the integrated circuit die to which the leads 18 from central bus portion 12 are to be attached. Generally, the size of central bus portion 12 will be slightly smaller than the die to expose the peripheral connections or pads 64 on the die, i.e., the sides of the central bus 12 will not extend over die pads 64 but will be smaller in width and length than the distance from the die pads on one side of the die to the pads on the opposite side.

It should be noted that while bus 12, and subsequent busses described below, are referred to as power busses, they may function as any type of bus normally associated with integrated circuits including a positive or negative voltage bus as well as a ground or neutral bus.

The patterning of metal layer 10 also provides an outer bus 22 which, as shown in the dotted lines in FIG. 1, may be divided into two or more bus portions with bus portion 22a and 22b illustrated as separated by lead 14 which is connected to central bus 12. One or more outwardly directed leads, such as illustrated lead 24a, connected respectively to bus portions 22a or 22b, provide external electrical connection to bus 22 while inwardly directed leads 28 provide electrical connection to individual pads 64 on integrated circuit die 60.

The inner dimensions of the bus portions comprising outer bus 22 will depend upon the size of die 60 to which the leads from the bus will be connected. Generally, however, the inner dimensions of outer bus 22 will be selected to be slightly larger than the respective width or length of die 60 to permit the inwardly extending leads 28 from outer bus 22 to extend over the pads 64 on die 60. The outer dimensions of bus 22 are not critical, but will rather be governed by the desired external dimensions of the package as well as the current carrying capacity desired for bus 22. Thus, lower metal layer 10 may provide two independent power busses for attachment to appropriate contact pads 64 on die 60.

Bonded to the top surface of metal layer 10 is a flexible dielectric layer 30 which may comprise a material such as Kapton, a fully imidized polyimide manufactured by DuPont. Another suitable plastic material is Tradlon manufactured by Exxon. The material should be flexible to permit conventional tape automated bonding (TAB) equipment to be utilized in bonding the lead frame assembly to the integrated circuit die as is conventionally done with a single metal layer lead frame strip.

Figure 1A:
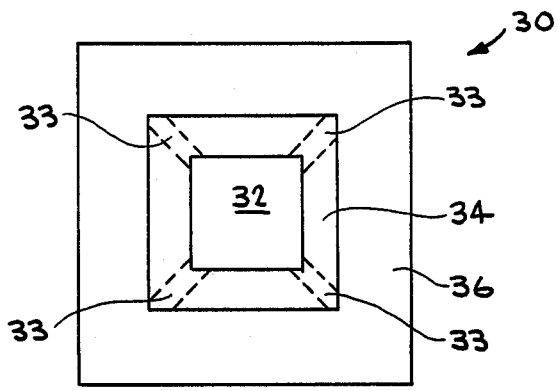
FIG. 1A is a top view of the dielectric layer of the lead frame assembly of FIG. 1.

As best seen in FIG. 1A, dielectric layer 30 comprises a rectangular central portion 32 which may be generally dimensioned to be slightly larger than the central bus 12 of first metal layer 10 as well as the central bus portion of second metal layer 40 as will be described below. Central dielectric portion 32, while it may be slightly larger than the central bus 12, is also governed in its dimensions by the size and shape of the integrated circuit die since central dielectric portion 32 must also be smaller than the configuration of the connection pads on the die so as to not interfere with electrical connections to be made thereto by the leads from the metal layers.

A peripheral second portion 36 of dielectric layer 30 surrounds central dielectric portion 32 leaving an opening 34 therebetween sufficiently wide to permit exposure and access to bonding pads 64 of integrated circuit die 60 by the leads from the upper metal layer as will be described.

As shown by the dotted lines 33 in FIG. 1A, the inner portion 32 of dielectric layer 30 and outer portion 36 may be optionally joined together, when desired, to provide some further rigidity and support for the assembly and insulation of the crossover leads such as, for example, diagonal lead 44 which provides external connection to bus 42. Of course, any such placement of such dielectric portions, such as portions 33, must be made so as to not interfere with electrical interconnection between the leads and lead pads 64 on die 60.

The external dimensions of dielectric layer 30, i.e., the external dimensions of peripheral portion 36, are not critical. However, generally, the external dimensions will be less than the outwardly extending metal leads, as best seen in FIG. 1, so as to not interfere with electrical connections to be made to such leads. The dimensions of the dielectric, as well as the outer dimensions of the metal layers from which the leads and busses are formed, are usually dictated by the dimensions of the carrier, substrate, or package to which the die and lead frame assembly will be subsequently mounted or attached.

Figure 5:
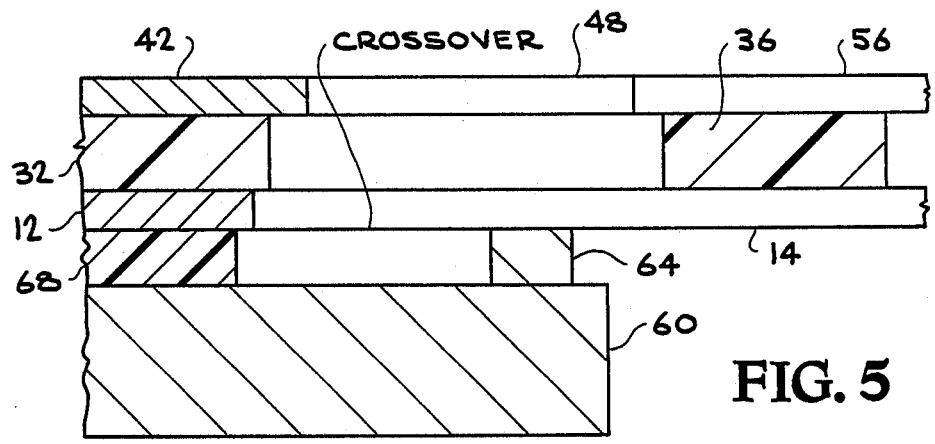
FIG. 5 is a fragmentary vertical cross section of a portion of the lead frame assembly of the invention illustrating the position of a lead comprising a part of the central bus formed by the central portion of the top layer prior to attachment of the lead to the integrated circuit die.
Figure 6:
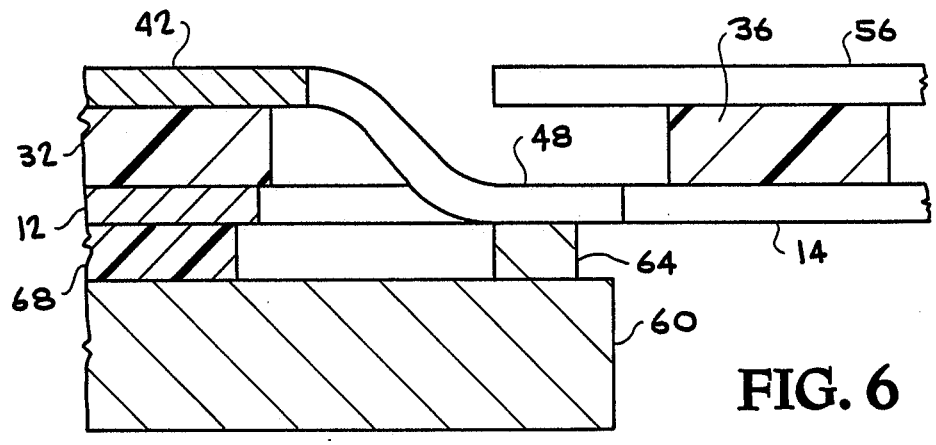
FIG. 6 is a fragmentary vertical cross section of the lead frame assembly of FIG. 5 illustrating the position of the lead of the top layer after attachment to the integrated circuit die.
Figure 6A:
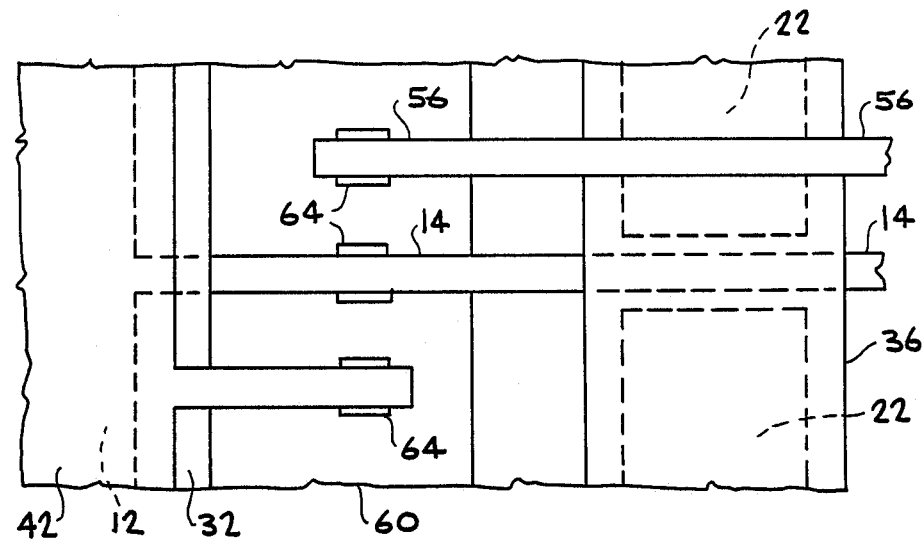
FIG. 6A is a fragmentary top view of the structure shown in FIG. 6.

Bonded to the upper surface of dielectric layer 30 is a second metal layer 40 which also may be patterned to comprise a central power bus 42 which is externally connected via one or more external power bus leads 44 to external portions of the integrated circuit package. Outwardly extended leads 48 interconnect bus 42 with lead pads 64 on integrated circuit die 60 in similar fashion to the leads 18 extending from lower central power bus 12. However, it will be noted, in FIG. 2, that the leads 48 from the upper central bus 42 must be bent downward to reach pads 64. Thus, in the initial patterning of upper layer 40, the additional length needed to permit such bending of leads 48 must be designed into the lead pattern. This is illustrated in the respective before and after drawings of FIGS. 5, and 6 and 6A. In FIGS. 5, 6, and 6A external power lead 14 is shown making connection to bus 12. It must be noted (as more clearly shown in FIG. 6A) that lead 14 crosses over the contact pad area behind the illustrated contact pad 64 and thus, lead 48 is not electrically connected to bus lead 14. It should also be noted that lead 56, in FIG. 6, is not shown connected to a die pad 64 merely for clarity of illustration.

In FIG. 6A, crossover lead 14, which provides external connection to bus 12, is also shown as making electrical connection to a die pad 64 on die 60. It will be appreciated that this is an optional feature or function of lead 14 which may or may not be utilized as desired.

Figure 3:
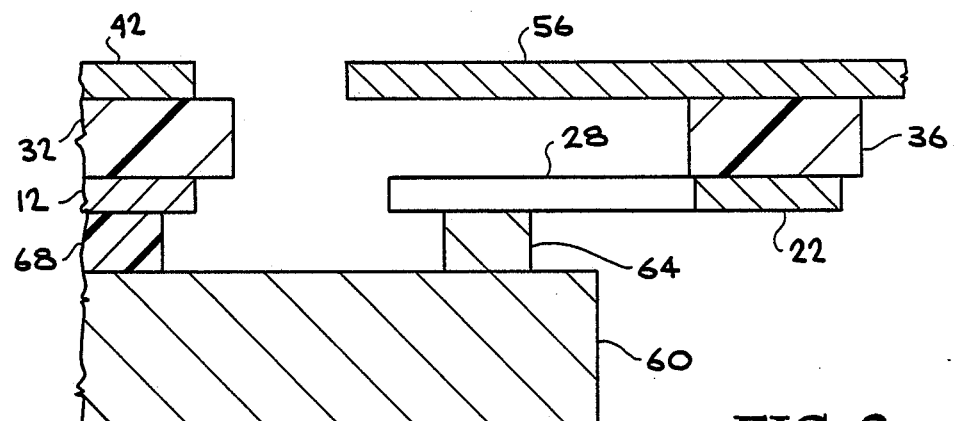
FIG. 3 is a fragmentary vertical cross section of a portion of the lead frame assembly of the invention illustrating the position of one of the leads of the top layer prior to attachment to the integrated circuit die.
Figure 4:
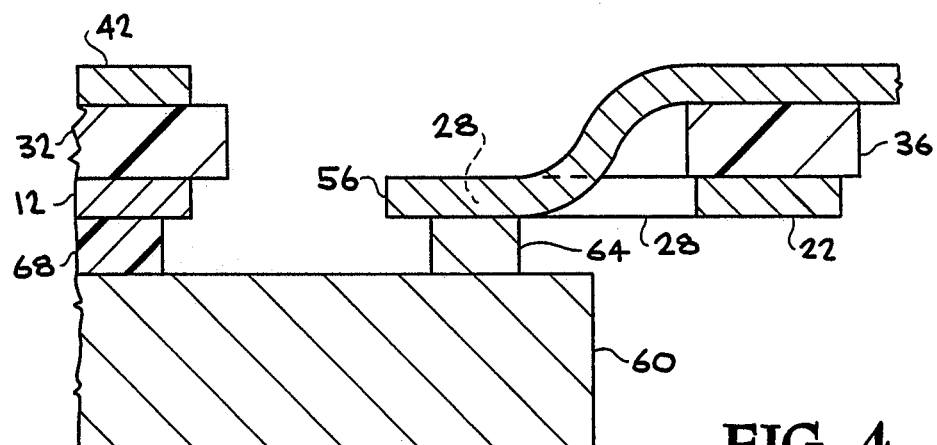
FIG. 4 is a fragmentary vertical cross section of the lead frame assembly of FIG. 3 illustrating the position of one of the leads of the top layer after attachment to the integrated circuit die.
Figure 4A:
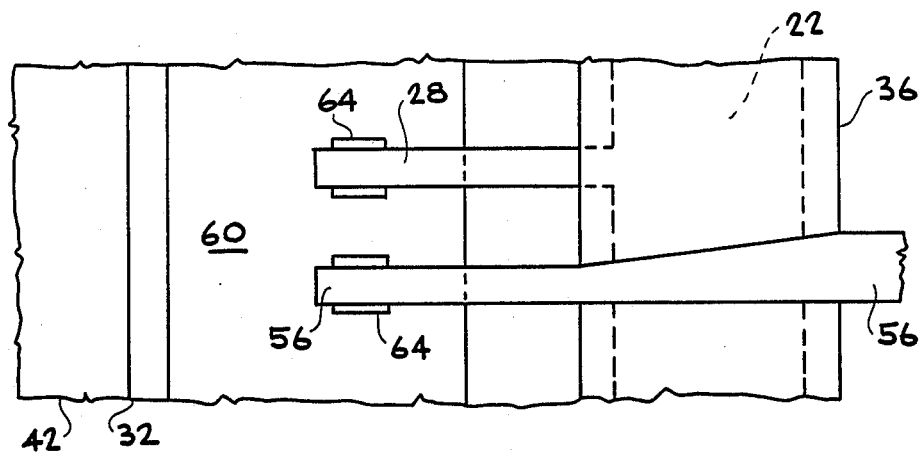
FIG. 4A is a fragmentary top view of the structure shown in FIG. 4.

The patterning of metal layer 40 also provides a series of outwardly directed leads 54 and 56 on lead frame assembly 2 to provide direct and electrically independent external electrical connection to specific contact pads 64. Leads 54 and 56 therefore comprise a series of leads which are individual in nature, i.e., they are not connected together in a bus type network. As shown in FIGS. 3 and 4, leads 54 and 56 must also be bent down to provide connection to die contact pads 64 and thus must be patterned with sufficient length to permit such bending. It should be noted that lead 28, extending from bus 22, is connected to another pad 64 behind the illustrated pad and thus is not electrically connected to lead 56.

As is well known to those skilled in the art, leads 54 and 56 may be externally joined together by a removable external band of metal such as the fragmentary portion 58 shown in FIG. 1, to facilitate the initial formation of the assembly, connection, plating, etc. This external band of metal 58, which also comprises a patterned portion of second metal layer 40, is then removed at some appropriate point in the manufacture prior to use of the integrated circuit package.

Figure 7:
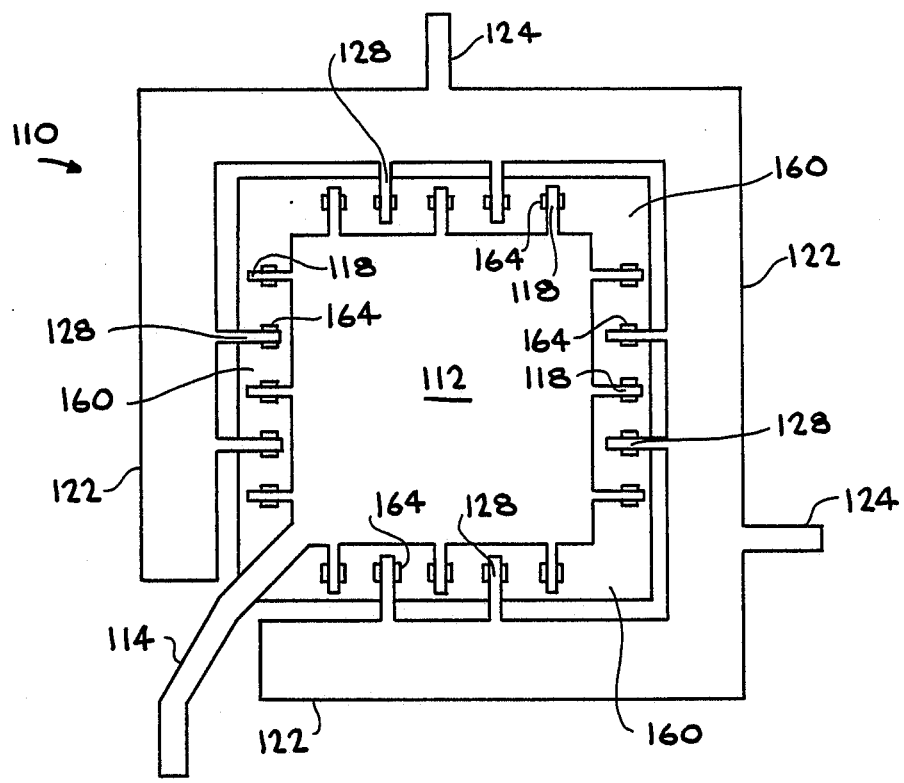
FIG. 7 is a top view of one of the layers of the lead frame assembly of the invention illustrating the formation of two busses from the same layer.

FIG. 7 illustrates a structure similar to the bottom (dotted line) metal layer of the assembly shown in FIG. 1 and is provided in the interest of clarity to show what may be either the top metal layer or the bottom metal layer patterned to form two busses, e.g., bus 12 and bus 22. In this embodiment, a metal layer 110 is patterned to provide an internal bus 112 and an external or peripheral bus 122. One or more power bus leads 114 provides external connection to bus 112 while power bus leads 124 provide similar external connection to bus 122. Leads 118 from central bus 112 connect the bus to pads 164 on an integrated circuit die 160 suitably mounted beneath busses 112 and 122. Similarly, leads 128 interconnect bus 122 with other pads 164 on die 160.

While FIG. 1 illustrates the bottom layer of the lead frame assembly of the invention as comprising two busses and the top layer as only having a central bus, with individual leads provided along the periphery of the top layer, it will be understood that such was shown for illustrative purposes only and individual leads may be provided around the periphery of both layers, with the top layer in FIG. 1 in such a case serving to illustrate either layer. Alternatively, the bottom layer of the lead frame assembly may be patterned as shown for the top layer of FIG. 1, i.e., having a number of individual leads, with the top layer of the lead frame assembly having two busses as shown in FIG. 7.

It will also be recognized that one of the busses in the layer shown in FIG. 7 may be eliminated if desired. Alternatively, the central bus shown in the top layer in FIG. 1, i.e., the layer with individual leads around the periphery, may be eliminated if it is only desired to have two busses in addition to the individual leads shown in the top layer of FIG. 1.

Figure 8:
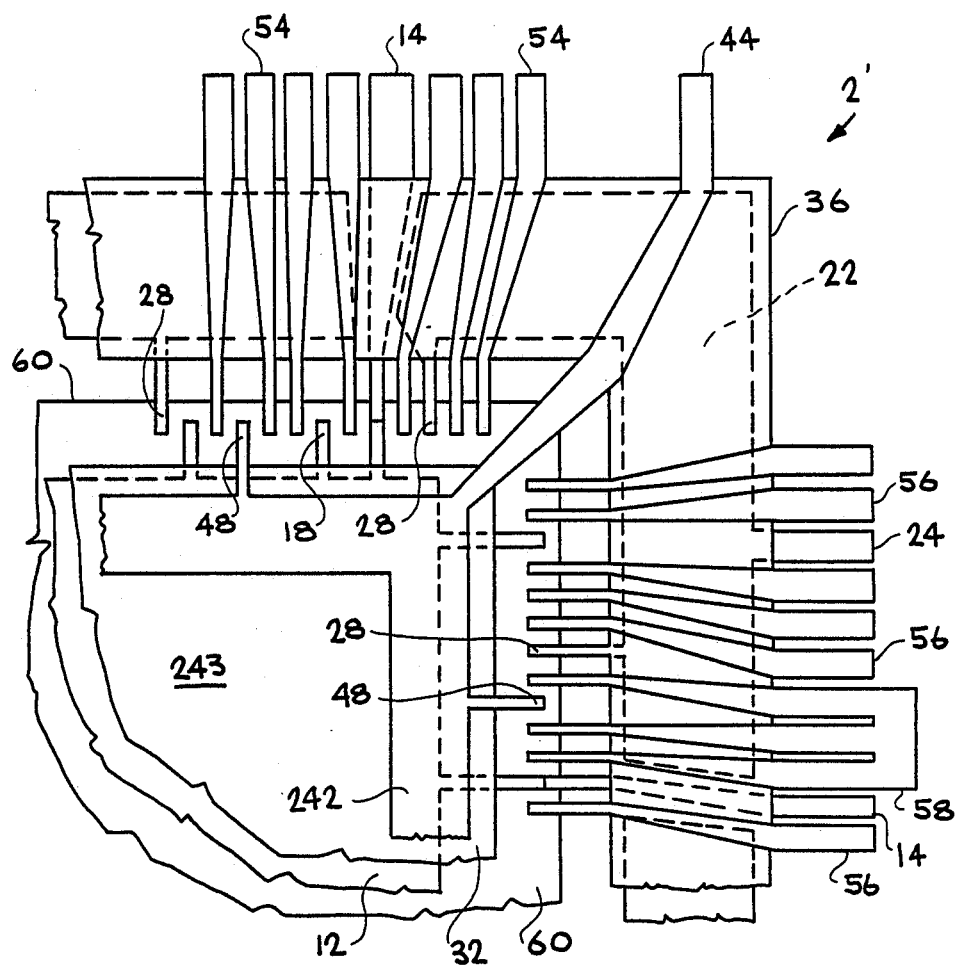
FIG. 8 is atop view of the configuration of one of the metal layers in another embodiment of the invention.
Figure 9:
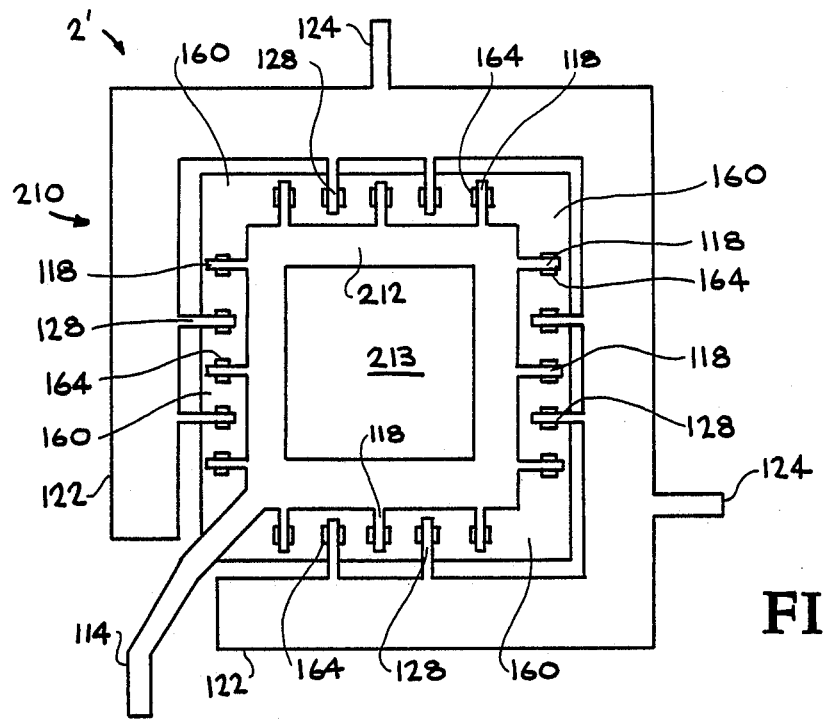
FIG. 9 is a top view of the configuration of the other metal layer in another embodiment of the invention.

FIGS. 8 and 9 show yet another embodiment wherein the central bus is not solid, but is rather formed as a picture frame having a wide metal portion extending around the perimeter with the central portion of the central bus shown in the earlier embodiment removed. This may be desirable in some applications, for example, to provide electrical isolation of the bus from certain portions of the die or to provide further thermal stress relief in the lead frame assembly.

Thus, as shown in FIG. 8, central bus 42 of the top layer in FIG. 1 has been replaced by central bus frame 242 of lead frame assembly 2' which may differ from bus 42 in FIG. 1 only by the removal of the center portion of the metal in bus 42 thus creating the opening 243 shown in FIG. 8. All of the leads 48 to die pads 64 as well as the bus leads 44 may remain the same in this embodiment, if desired.

Similarly, as shown in FIG. 9, the metal layer 210 of lead frame assembly 2', having both a central bus and a peripheral bus, such as the metal layer 110 depicted in FIG. 7, may have the solid central bus, e.g., central bus 112 of the layer in FIG. 7, replaced by central bus frame 212 of lead frame assembly 2' which may differ from bus 112 in FIG. 7 only by the removal of the center portion of the metal in bus 112 thus creating the opening 213 shown in FIG. 9. All of the leads 118 to die pads 164 as well as the bus leads 114 may remain the same in this embodiment, if desired.

Figure 10:
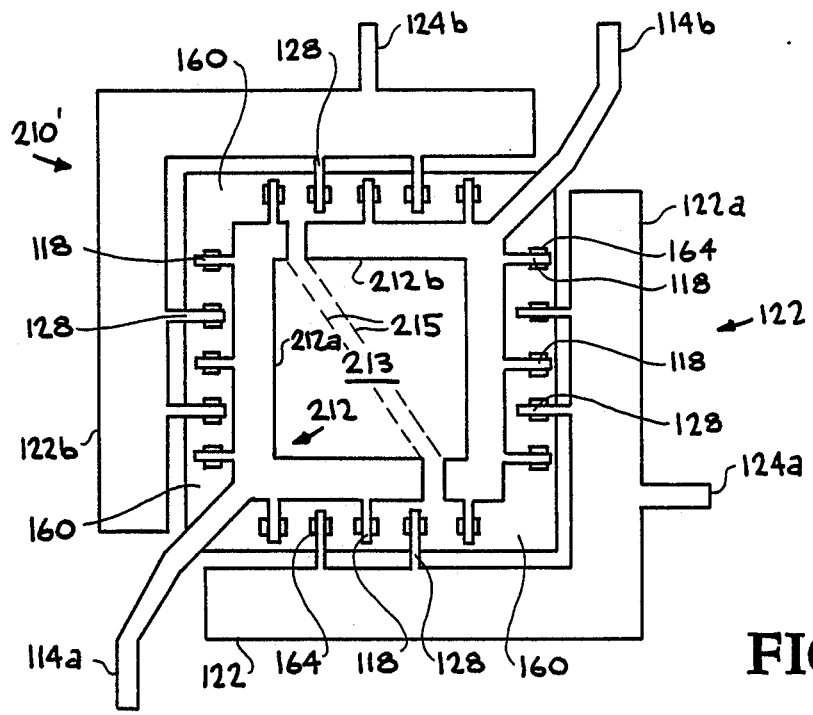
FIG. 10 is a top view of a variation of the embodiment shown in FIG. 9

Yet another embodiment of the invention is illustrated in FIG. 10 wherein central bus 212 of metal layer 210 of FIG. 9 is divided into two bus segments 212a and 212b of metal layer 210', each having one or more respective outer leads, 114a and 114b, to provide external connection to the respective bus segment. Bus segments 212a and 212b may comprise the picture frame shape shown in the embodiment of FIG. 9 or, as shown by dotted lines 215, the bus segments may comprise segments of a solid internal bus such as bus 12 in FIG. 1 with dotted lines 215 indicating the separation between the bus segments in such a case.

Outer bus 122 is also divided into two bus segments, 122a and 122b, each of which is respectively provided with an external lead 124a and 124b. By dividing the respective busses 212 and 122 into separate bus segments, electrical connection may be made to two or more separate areas of the die on which may be formed circuit structures independent from the remainder of the die.

Figure 11:
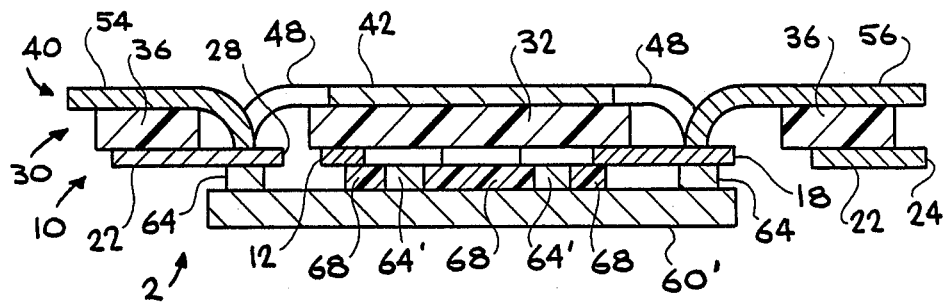
FIG. 11 is a vertical cross section of yet another embodiment of the invention.

In another embodiment of the invention illustrated in FIG. 11, central bus 12 formed from layer 10 has one or more connections formed to die 60 through contacts or pads 64' which are formed in the portion of die 60' immediately below bus 12, which may be defined as contacts adjacent the center of die 60' to distinguish them from peripheral contact pads 64 which are formed on die 60' outside the circumference of bus 12. No leads, of course, need be used to make such connections. Rather the contact pad 64' and bus 12 may be directly bonded together.

Figure 12:
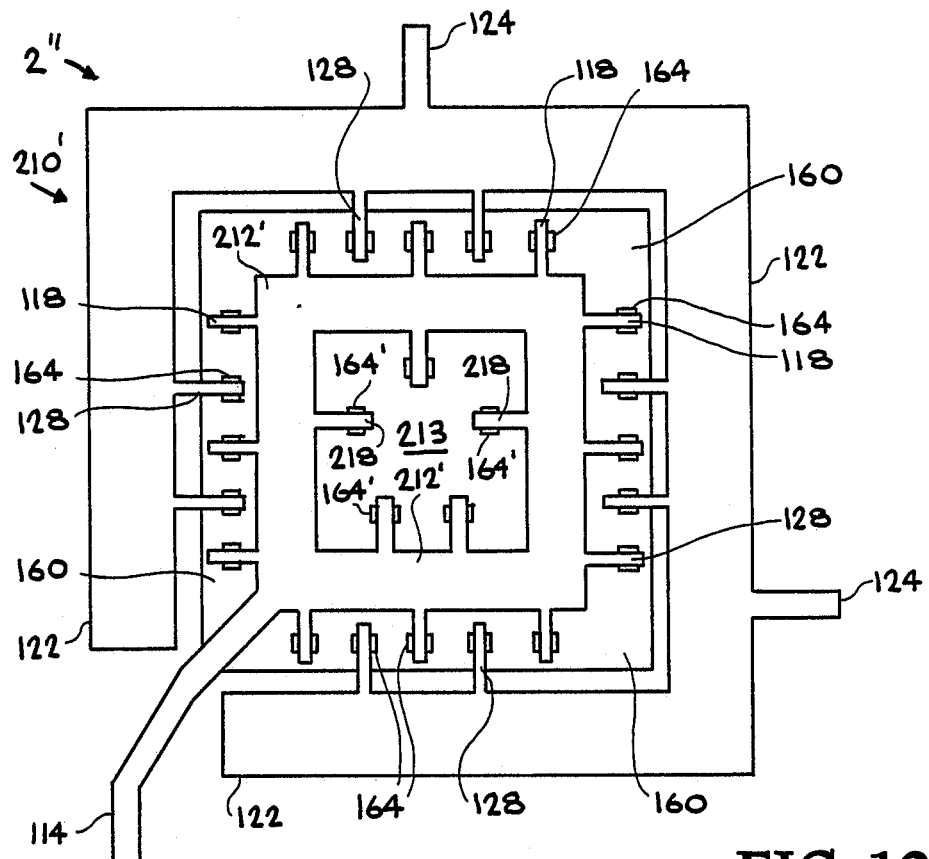
FIG. 12 is a top view of yet another embodiment of the invention.

In still another embodiment, as shown in FIG. 12, bus 212 formed from layer 210 of FIG. 9 has been further modified to provide a lead frame assembly 2" with inwardly depending contact fingers or leads 218 on bus 212' which permit selective contact to interior contact pads 164' on die 160'.

Formation of the lead frame assembly of the invention may comprise the initial formation of a three layer assembly comprising a first metal layer, a dielectric layer, and a second metal layer suitably bonded together. The metal layers may be masked, using suitable photolithographic techniques, to provide the desired lead and bus patterns thereon. The metal layers may then be reactive ion etched, or chemically etched, to provide the respective desired lead and bus patterns. The exposed dielectric may then be removed with a suitable solvent, or by suitable dry etching techniques. Alternatively, the metal layers, and/or the dielectric layer, may be patterned prior to bonding together if desired. Other alternate methods of assembly or patterning may be employed whenever appropriate.

Thus, it can be seen that the invention provides an improved lead frame assembly structure wherein up to three busses may be provided in addition to the conventional individual leads to thereby provide power busses for the integrated circuit die which are external to the die itself, yet incorporated into a flexible lead frame tape assembly which may be still handled in similar fashion to the conventional TAB systems now in use.

Having thus described the invention, what is claimed is:

1. An improved integrated flexible circuit lead frame assembly for mounting an integrated circuit die comprises a first conductive metal layer comprising one or more metal leads capable of being electrically connected directly to said die, a flexible dielectric layer attached to at least a portion of said first conductive metal layer, and a second metal conductive layer having a portion attached to the opposite side of said dielectric layer and also comprising one or more leads capable of being electrically attached directly to said die, at least one of said metal layers further comprising at least one metal bus pattern with one or more metal leads capable of being electrically attached directly to said die extending from said metal bus pattern.

2. The integrated circuit flexible lead frame assembly of claim 1 wherein each of said two conductive metal layers comprises at least one metal bus with one or more leads for interconnecting said metal bus with portions of said integrated circuit die.

3. The integrated circuit flexible lead frame assembly of claim 30 wherein at least one of said metal layers comprises a central bus portion having outer dimensions sufficiently smaller than the dimensions of an integrated circuit die to be connected thereto to permit leads extending outwardly from said central bus portion to be connected directly to said integrated circuit die.

4. The integrated circuit flexible lead frame assembly of claim 3 wherein said central bus portion comprises a solid central metal portion.

5. The integrated circuit flexible lead frame assembly of claim 3 wherein said central bus portion comprises a rectangular frame of metal having a central cutaway portion.

6. The integrated circuit flexible lead assembly of claim 3 wherein said central bus portion comprises two or more central bus segments electrically independent from one another.

7. The integrated circuit flexible lead frame assembly of claim 30 wherein one of said metal layers includes an outer bus member having inner dimensions generally larger than the external dimensions of an integrated circuit die to be connected thereto to permit inwardly extending leads from said outer bus member to be attached directly to said die.

8. The integrated circuit flixible lead assembly of claim 7 wherein said outer bus member comprises two or more outer bus segments electrically independent from one another.

9. The integrated circuit flexible lead frame assembly of claim 30 wherein one of said metal layers includes an outer bus member having inner dimensions generally larger than the external dimensions of an integrated circuit die to be connected thereto to permit inwardly extending leads from said outer bus member to be attached directly to said die and at least one of said metal layers also comprises a central bus portion having outer dimensions sufficiently smaller than the dimensions of said integrated circuit die to be connected thereto to permit leads extending outwardly from said central bus portion to be connected directly to said die.

10. The integrated circuit flexible lead frame assembly of claim 9 wherein both of said metal layers include said central bus portion.

11. The integrated circuit flexible lead frame assembly of claim 10 wherein each of said busses further comprises at least one lead attached thereto to provide external electrical connection to the respective bus.

12. An improved integrated circuit flexible lead frame assembly for mounting an integrated circuit die comprising:
(a) a first conductive metal layer comprising a plurality of metal leads extending outwardly from points over the periphery of said integrated circuit die and capable of being electrically connected at their inner ends to said die, and a central bus portion having outer dimensions sufficiently smaller than the dimensions of said integrated circuit die to be connected thereto to permit leads extending outwardly from said central bus portion to be connected to said die;
(b) a second metal conductive layer comprising an outer bus member having inner dimensions generally larger than the external dimensions of said integrated circuit die to be connected thereto to permit inwardly extending leads from said outer bus member to be attached to said die and a central bus portion having outer dimensions sufficiently smaller than the dimensions of said integrated circuit die to be connected thereto to permit leads extending outwardly from said central bus portion to be connected to said die; and (c) a flexible dielectric layer between said metal layers and comprising a central portion between said central bus of said first metal layer and said central bus of said second metal layer and an outer portion separating said outwardly extending leads of said first metal layer from said outer bus member of said second metal layer;

whereby said lead frame assembly is provided with a plurality of individual leads for connection to points on said die and with three busses with leads extending therefrom for connection to points on said integrated circuit die.

13. An improved integrated circuit flexible lead frame assembly 2 for mounting an integrated circuit die 60 comprises a first conductive metal layer 10 comprising metal leads 18 and 28 capable of being electrically connected directly to said die, a flexible dielectric layer 30 attached to at least a portion of first conductive metal layer 10, and a second metal conductive layer 40 having a portion attached to the opposite side of dielectric layer 30 and comprising leads 48, 54, and 56 capable of being electrically attached directly to said die 60, at least one of said metal layers 10 or 40 further comprising at least one metal bus pattern 12 or 22 or 42 with metal leads 18 or 28 or 48 capable of being electrically attached directly to die 60 extending from said metal bus pattern.

14. The integrated circuit flexible lead frame assembly 2 of claim 13 wherein each of said two conductive metal layers 10 and 40 comprises at least one metal bus 12 or 22 or 42 with leads 18, 28, or 48 for interconnecting said metal bus with die pads 64 of integrated circuit die 60.

15. The integrated circuit flexible lead frame assembly 2 of claim 14 wherein at least one of said metal layers 10 or 40 comprises a central bus portion 12 or 42 having outer dimensions sufficiently smaller than the dimensions of integrated circuit die 60 to be connected directly thereto to permit leads 18 or 48 extending outwardly from said central bus portion 10 or 40 to be connected to pads 64 on integrated circuit die 60.

16. The integrated circuit flexible lead frame assembly 2 of claim 15 wherein said central bus portion 12 or 42 comprises a solid central metal portion.

17. The integrated circuit flexible lead frame assembly 2' of claim 15 wherein said central bus portion comprises a rectangular frame of metal 212 or 242 having a central cutaway portion 213 or 243.

18. The integrated circuit flexible lead frame assembly 2" of claim 17 wherein central bus portion 212' is provided with inwardly depending leads 218 electrically connectable directly to one or more contacts 164' on die 160' adjacent the center of the die.

19. The integrated circuit flexible lead frame assembly 2 of claim 14 wherein one of said metal layers 10 or 40 includes an outer bus member 22 having inner dimensions generally larger than the external dimensions of integrated circuit die 60 to be connected thereto to permit inwardly extending leads 28 from said outer bus member 22 to be attached dirtectly to die pads 64 on die 60.

20. The integrated circuit flexible lead frame assembly 2 of claim 14 wherein one of said metal layers 10 or 40 includes an outer bus member 22 having inner dimensions generally larger than the external dimensions of an integrated circuit die 60 to be connected thereto to permit inwardly extending leads 28 from said outer bus member 22 to be attached directly to die pads 64 on said die 60 and at least one of said metal layers 10 and 40 also comprises a central bus portion 12 or 42 having outer dimensions sufficiently smaller than the dimensions of said integrated circuit die 60 to be connected thereto to permit leads 18 or 48 extending outwardly from said central bus portion 12 or 42 to be connected directly to die pads 64 on said die 60.

21. The integrated circuit flexible lead frame assembly 2 of claim 20 wherein said metal layer 10 includes said central bus portion 12 and said metal layer 40 includes said central bus portion 42.

22. The integrated circuit flexible lead frame assembly of claim 21 wherein each of said busses 12, 22, and 42 respectively further comprises at least one lead 14, 24, or 44 attached thereto to provide external electrical connection to the respective bus.

23. An improved integrated circuit flexible lead frame assembly 2 for mounting an integrated circuit die 60 thereto comprising:

(a) a first metal conductive layer 10 comprising an outer bus member 22 having inner dimensions generally larger than the external dimensions of said integrated circuit die 60 to be connected thereto to permit inwardly extending leads 28 from said outer bus member 22 to be attached to die pads 64 on said die 60 and a central bus portion 12 having outer dimensions sufficiently smaller than the dimensions of said integrated circuit die 60 to be connected thereto to permit leads 18 extending outwardly from said central bus portion 12 to be connected to die pads 64 on said die 60;

(b) a second conductive metal layer 40 comprising a plurality of metal leads 54 and 56 extending outwardly from points over the periphery of said integrated circuit die 60 and capable of being electrically connected at their inner ends to die pads 64 on said die 60, and a central bus portion 42 having outer dimensions sufficiently smaller than the dimensions of integrated circuit die 60 to be coonnected thereto to permit leads 48 extending outwardly from said central bus portion 42 to be connected to said die pads 64 on said die 60; and (c) a flexible dielectric layer 30 between said metal layers 10 and 40 and comprising a central portion 32 between said central bus 12 of said first metal layer 10 and said central bus 42 of said second metal layer 40 and an outer portion 36 separating said outwardly extending leads 54 and 56 of said second metal layer 40 from said outer bus member 22 of said first metal layer 10;

whereby said lead frame assembly 2 is provided with a plurality of individual leads 54 and 56 for connection to individual die pads 64 on said die 60 and with three busses 12, 22, and 42 with leads 18, 28, and 48 respectively extending therefrom for connection to other die pads 64 on said integrated circuit die 60.

24. An improved integrated circuit package comprising a flexible lead frame assembly 2 having an integrated circuit die 60 mounted thereto comprising:

(a) a first metal conductive layer 10 comprising:
(1) an outer bus member 22 having inwardly extending leads 28 from said outer bus member 22 attached to die pads 64 on said die 60, and one or more outwardly extending leads 24 to provide external electrical connection to said outer bus member 22, said outer bus member 22 having inner dimensions generally larger than the external dimensions of said integrated circuit die 60 connected thereto to facilitate said connection of said inwardly extending leads 28 to said die pads 64 on die 60; and (2) a central bus portion 12 having leads 18 extending outwardly from said central bus portion 12 and connected to die pads 64 on said die 60, and one or more leads 14 to provide external connection to said central bus portion 12, said central bus portion 12 having outer dimensions sufficiently smaller that the dimensions of said integrated circuit die 60 connected thereto to facilitate connection of said leads 18 to said die pads 64 on die 60;

(b) a second conductive metal layer 40 comprising:
(1) a plurality of metal leads 54 and 56 extending outwardly from points over the periphery of said integrated circuit die 60 and electrically connected respectively at their inner ends to respective die pads 64 on said die 60; and
(2) a central bus portion 42 having leads 48 extending outwardly from said central bus portion 42 and connected to said die pads 64 on said die 60, and one or more leads 44 to provide external connection to said central bus portion 42, said central bus portion 42 having outer dimensions sufficiently smaller than the dimensions of integrated circuit die 60 connected thereto to facilitate connection of said leads 48 to said die pads 64 on die 60; and (c) a flexible dielectric layer 30 between said metal layers 10 and 40 and comprising a central portion 32 between said central bus 12 of said first metal layer 10 and said central bus 42 of said second metal layer 40 and an outer portion 36 separating said outwardly extending leads 54 and 56 of said second metal layer 40 from said outer bus member 22 of said first metal layer 10;

whereby said lead frame assembly 2 is provided with a plurality of individual leads 54 and 56 connected to individual die pads 64 on said die 60 and with three busses 12, 22, and 42 with leads 18, 28, and respectively extending therefrom and connected to other die pads 64 on said integrated circuit die 60.

25. The integrated circuit flexible lead frame assembly 2 of claim 22 wherein said central bus portion 12 or 42 comprises a solid central metal portion.

26. The integrated circuit flexible lead frame assembly 2 of claim 23 wherein said integrated circuit die 60' is provided with one or more contacts 64' adjacent the center of said die which are electrically connected directly to the underside of bus 12.

27. The integrated circuit flexible lead frame assembly 2' of claim 22 wherein said central bus portion 12 comprises a rectangular frame of metal 212 or 242 having a central cutaway portion 213 or 243.

28. The integrated circuit flexible lead frame assembly 2" of claim 25 wherein central bus portion 212' is provided with inwardly depending leads 218 electrically connected to one or more contacts 164' on die 160' adjacent the center of the die.

29. An improved flexible integrated circuit lead frame assembly for mounting an integrated circuit die comprising a first conductive metal layer comprising one or more metal leads capable of being electrically connected directly to said die, a flexible dielectric layer attached to at least a portion of said first conductive metal layer, and a second metal conductive layer having a portion attached to the opposite side of said dielectric layer and also comprising one or more leads capable of being electrically connected directly to said die, each of said metal layers further comprising at least one metal bus pattern including one or more metal leads capable of being electrically connected directly to said die extending from said metal bus patterns.

30. An improved flexible integrated circuit lead frame assembly for mounting an integrated circuit die thereon which comprises:
(a) a series of independent leads comprising portions of a first metal layer, and having lead portions attached to a dielectric layer, and individually capable of being electrically connected directly to said integrated circuit die;
(b) a first central metal bus formed from the remainder of said first metal layer with leads extending outwardly therefrom to make direct electrical contact with said integrated circuit die;
(c) a second central bus formed from a second metal layer attached to the opposite side of said dielectric layer with leads extending outwardly therefrom to make direct electrical contact with said integrated circuit die; and
(d) an external bus also formed from said second metal layer with leads extending therefrom inwardly to make direct contact electrical with said integrated circuit die.

* * * * *